United States Patent
Jeong et al.

(10) Patent No.: US 10,163,391 B2
(45) Date of Patent: Dec. 25, 2018

(54) DISPLAY APPARATUS

(71) Applicant: SAMSUNG DISPLAY CO., LTD., Yongin-si, Gyeonggi-do (KR)

(72) Inventors: Cheolyun Jeong, Yongin-si (KR); Mugyeom Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 213 days.

(21) Appl. No.: 15/181,165

(22) Filed: Jun. 13, 2016

(65) Prior Publication Data

US 2017/0150617 A1    May 25, 2017

(30) Foreign Application Priority Data

Nov. 24, 2015  (KR) .................. 10-2015-0164831

(51) Int. Cl.
  *G09G 3/3225* (2016.01)
  *G02F 1/1333* (2006.01)
  *H01L 27/32* (2006.01)

(52) U.S. Cl.
  CPC ......... *G09G 3/3225* (2013.01); *G02F 1/1333* (2013.01); *H01L 27/3276* (2013.01); *G09G 2300/0809* (2013.01)

(58) Field of Classification Search
  CPC .. G09G 3/3225; G02F 1/1333; H01L 27/3276
  See application file for complete search history.

(56) References Cited

U.S. PATENT DOCUMENTS

| | | | | |
|---|---|---|---|---|
| 4,772,100 A | * | 9/1988 | Suenaga | G02F 1/13452 349/149 |
| 4,958,911 A | * | 9/1990 | Beiswenger | G02F 1/133604 174/559 |
| 5,168,384 A | * | 12/1992 | Genba | G02F 1/13452 348/790 |
| 6,945,789 B2 | * | 9/2005 | Kuwaharada | G02F 1/13452 349/150 |
| 8,716,932 B2 | * | 5/2014 | Rappoport | H01L 27/3276 313/504 |
| 9,098,242 B2 | * | 8/2015 | Rappoport | G06F 1/1656 |
| 9,214,640 B2 | * | 12/2015 | Lee | H01L 51/0097 |
| 9,226,408 B2 | * | 12/2015 | Bang | H05K 1/147 |

(Continued)

FOREIGN PATENT DOCUMENTS

KR  10-2013-0007312 A   1/2013
KR  10-2014-0122960 A   10/2014

*Primary Examiner* — Nathan Milakovich
(74) *Attorney, Agent, or Firm* — Lewis Roca Rothgerber Christie LLP

(57) ABSTRACT

A display apparatus includes: display panel including a display area, a first peripheral area outside a first end of the display area, and a second peripheral area outside a second end of the display area opposite the first end of the display area; and a first electronic device arranged over a rear surface of the display area and electrically connected to the first peripheral area and the second peripheral area. A portion of the display panel between the display area and the first end and a portion of the display panel between the display area and the second end are bent such that the first peripheral area and the second peripheral area are arranged over the rear surface of the display area.

8 Claims, 5 Drawing Sheets

(56) References Cited

U.S. PATENT DOCUMENTS

| | | | |
|---|---|---|---|
| 2011/0007042 A1* | 1/2011 | Miyaguchi | G02F 1/133305 345/204 |
| 2011/0267329 A1* | 11/2011 | Sung | G09G 3/3208 345/211 |
| 2013/0002572 A1 | 1/2013 | Jin et al. | |
| 2013/0279088 A1 | 10/2013 | Raff et al. | |
| 2014/0002385 A1* | 1/2014 | Ka | G06F 1/1601 345/173 |
| 2014/0306941 A1 | 10/2014 | Kim et al. | |
| 2014/0333858 A1 | 11/2014 | Martisauskas | |

* cited by examiner

DISPLAY APPARATUS

CROSS-REFERENCE TO RELATED APPLICATION

This application claims priority to and the benefit of Korean Patent Application No. 10-2015-0164831, filed on Nov. 24, 2015 in the Korean Intellectual Property Office, the disclosure of which is incorporated herein in its entirety by reference.

BACKGROUND

1. Field

One or more embodiments relate to a display apparatus.

2. Description of the Related Art

Generally, a display apparatus has a configuration in which a plurality of display devices are arranged in a display area and electric signals, transmitted through elements (e.g., pads) arranged outside the display area, are applied to the plurality of display devices in the display area. The electric signals applied to the display devices include various signals, such as a scan signal, a data signal, a power signal, etc.

However, generally, as a size of a display apparatus increases, the quality of images displayed thereby degrades. For example, as a display apparatus becomes larger, lengths of wires for transmitting electric signals to be applied to the display devices increase, and thus, electric signals different from pre-set electric signals (e.g., different from the inputted electric signals) are applied to some of the display devices. As a result, the display apparatus may display an image different from an intended image, which is understood to be a low quality image.

SUMMARY

One or more embodiments include a display apparatus capable of displaying high quality images.

Additional aspects will be set forth, in part, in the description which follows and, in part, will be apparent from the description or may be learned by practice of the presented embodiments.

According to one or more embodiments, a display apparatus includes: a display panel including a display area, a first peripheral area outside a first end of the display area, and a second peripheral area outside a second end of the display area opposite the first end of the display area; and a first electronic device arranged over a rear surface of the display area and electrically connected to the first peripheral area and the second peripheral area. A portion of the display panel between the display area and the first end and a portion of the display panel between the display area and the second end are bent such that the first peripheral area and the second peripheral area are arranged over the rear surface of the display area.

The display area may have a major axis and a minor axis, and the first peripheral area and the second peripheral area may extend parallel to the major axis.

The first electronic device may include a DC-DC converter.

The display apparatus may further include: a power supply line at the display area; and a first power pad and a second power pad. The first and second power pads may be electrically connected to the power supply line and may be respectively arranged at the first peripheral area and the second peripheral area. The DC-DC converter may be electrically connected to the first and second power pads.

The display apparatus may further include a second electronic device arranged over the rear surface of the display area. The display panel may further include a third peripheral area and a fourth peripheral area. The third peripheral area may extend parallel to the minor axis and may be arranged outside a third end of the display area, and the fourth peripheral area may extend parallel to the minor axis and may be arranged outside a fourth end of the display area opposite the third end of the display area. The second electronic device may be electrically connected to the third peripheral area and the fourth peripheral area. A portion of the display panel between the display area and the third end and a portion of the display panel between the display area and the fourth end may be bent such that the third peripheral area and the fourth peripheral area are arranged over the rear surface of the display area.

The second electronic device may include a driver.

The display apparatus may further include: a scan line arranged at the display area; a data line arranged at the display area; a scan pad electrically connected to the scan line and the driver and arranged at the third peripheral area; and a data pad electrically connected to the data line and the driver and arranged at the fourth peripheral area.

The portion of the display panel between the display area and the third end and the portion of the display panel between the display area and the fourth end may be bent such that a rear surface of the third peripheral area and the rear surface of the display area face each other and a rear surface of the fourth peripheral area and the rear surface of the display area face each other.

The portion of the display panel between the display area and the first end and the portion of the display panel between the display area and the second end may be bent such that a rear surface of the first peripheral area and the rear surface of the display area face each other and a rear surface of the second peripheral area and the rear surface of the display area face each other.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
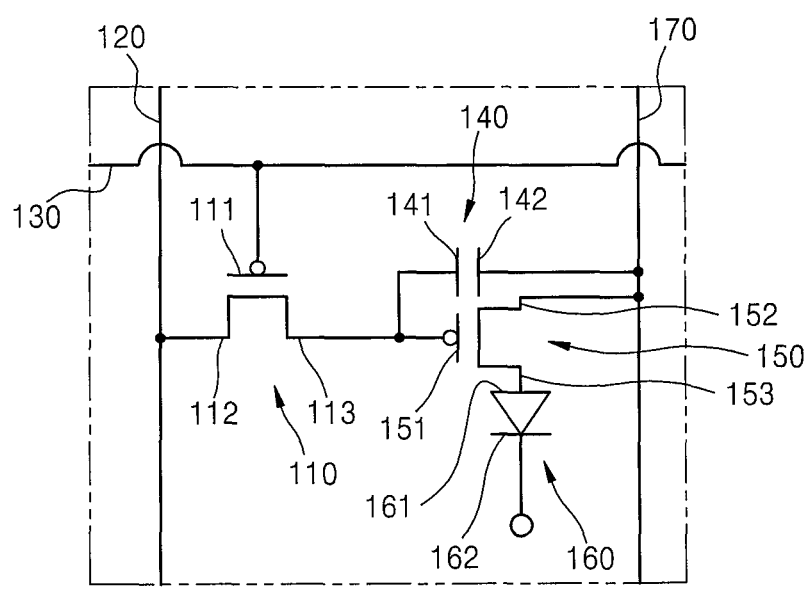
FIG. 1 is a circuit diagram illustrating a pixel circuit of a pixel of a display apparatus according to an embodiment.

Reference will now be made, in detail, to exemplary embodiments, examples of which are illustrated in the accompanying drawings. Like reference numerals refer to like elements throughout. The presented embodiments may have different forms and should not be construed as being limited to the descriptions set forth herein. Accordingly, exemplary embodiments are merely described below, by referring to the figures, to explain aspects of the present description.

It will be understood that when an element or layer is referred to as being "on," "connected to," or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Furthermore, sizes of elements in the drawings may be exaggerated for convenience of explanation. Thus, because sizes and thicknesses of components in the drawings may be arbitrarily illustrated for convenience of explanation, the following embodiments are not limited thereto.

In the following examples, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

The driver and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the driver may be formed on one integrated circuit (IC) chip or on separate IC chips. Further, the various components of the driver may be implemented on a flexible printed circuit film, a tape carrier package (TCP), a printed circuit board (PCB), or formed on a same substrate as the driver. Further, the various components of the driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

FIG. 1 is a circuit diagram illustrating a pixel circuit of a pixel of a display apparatus according to an embodiment. In more detail, FIG. 1 is a circuit diagram of a pixel of a display apparatus including organic light-emitting devices according to an embodiment.

Each pixel includes a first thin-film transistor (TFT) 110 driven by a driving circuit, a second TFT 150 driven by the first TFT 110, and an organic light-emitting device 160 driven by the second TFT 150.

A first source electrode 112 of the first TFT 110 is connected to the driving circuit via a first wire 120, a first gate electrode 111 of the first TFT 110 is connected to the driving circuit via a second wire 130, and a first drain electrode 113 of the first TFT 110 is connected to a first capacitor electrode 141 of a storage capacitor 140 and a second gate electrode 151 of the second TFT 150. In this embodiment, the first wire 120 may be understood as being a data line for transmitting data to the pixel, whereas the second wire 130 may be understood as being a scan line. In this embodiment, the first TFT 110 functions as a switching transistor, whereas the second TFT 150 functions as a driving transistor. In addition, the pixel circuit may include two or more TFTs.

A second capacitor electrode 142 of the storage capacitor 140 and a second source electrode 152 of the second TFT 150 are connected to a third wire 170, whereas a second drain electrode 153 of the second TFT 150 is connected to a pixel electrode 161 of the organic light-emitting device 160. A counter electrode 162 of the organic light-emitting device 160 is arranged a distance from (e.g., a certain distance from) the pixel electrode 161, and an intermediate layer including an emission layer is arranged between the pixel electrode 161 and the counter electrode 162. In this embodiment, the third wire 170 may correspond to a power supply line via which power is supplied to the organic light-emitting device 160 to emit light.

Figure 2:
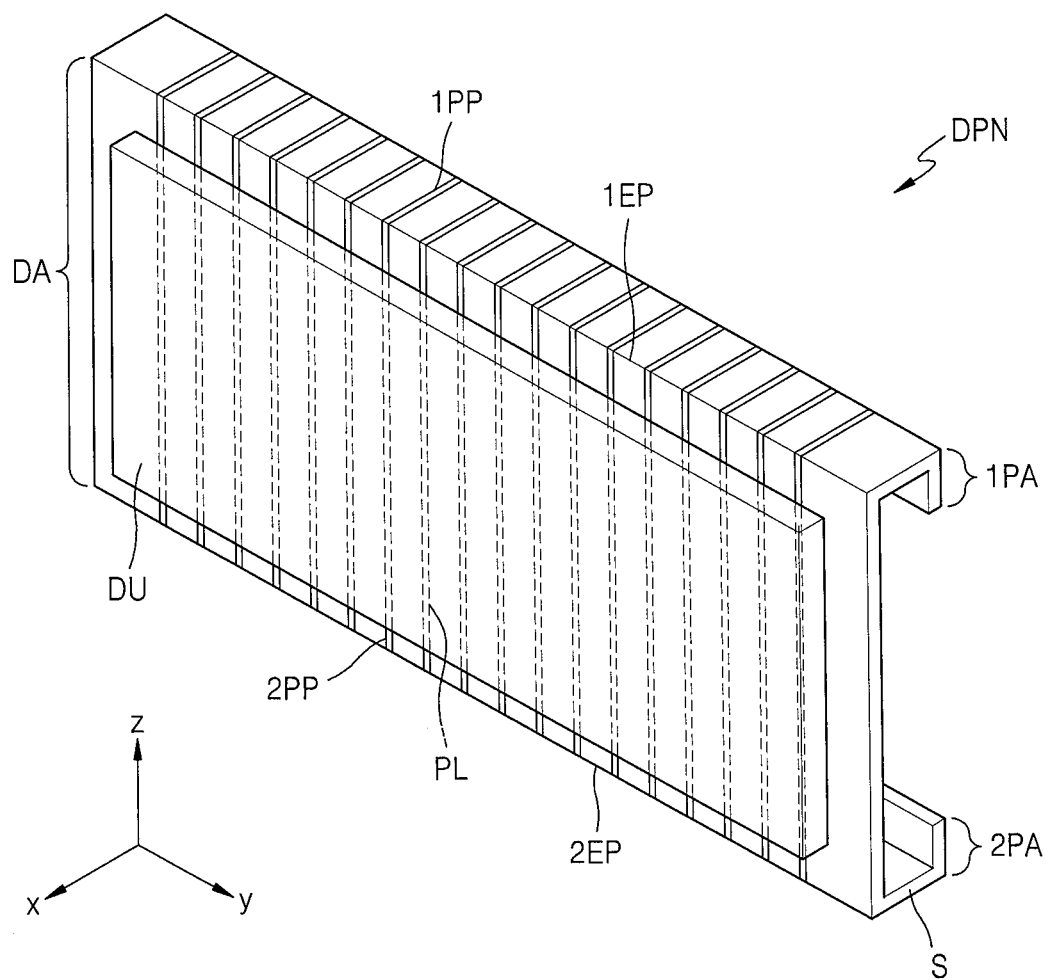
FIG. 2 is a schematic perspective view of a portion of a display apparatus according to an embodiment.
Figure 3:
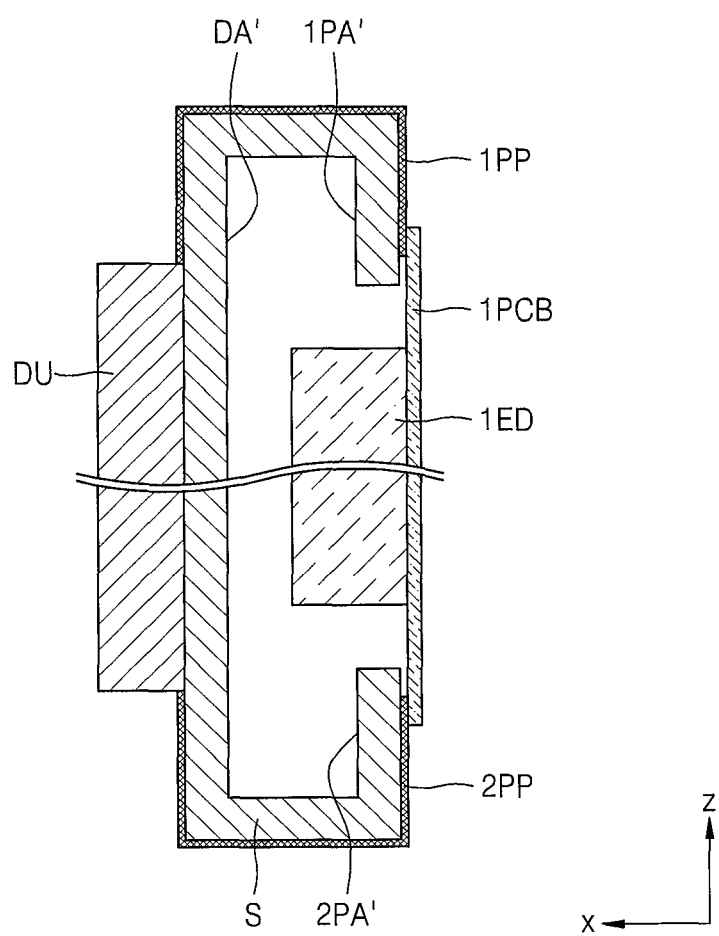
FIG. 3 is a schematic sectional view of the display apparatus shown in FIG. 2.

FIG. 2 is a schematic perspective view of a portion of a display apparatus according to an embodiment, and FIG. 3 is a schematic sectional view of the display apparatus shown in FIG. 2. As shown in FIGS. 2 and 3, the display apparatus according to the present embodiment includes a display panel DPN and a first electronic device 1ED.

The display panel DPN includes a display area DA, a first peripheral area 1PA, and a second peripheral area 2PA. The display area DA is an area in which an image may be displayed. The display panel DPN may include a display DU including a display device, such as an organic light-emitting device, a liquid crystal display (LCD) device, an electrophoretic device, etc., at the display area DA. An image may be displayed on the entire surface of the display area DA or on a portion (e.g., on only a portion) of the display area DA. For example, the display area DA may display an image at a portion thereof near a first end portion 1EP (e.g., a first end in the positive z-axis direction) and at a portion thereof near a second end portion 2EP at the opposite side (e.g., at a second end in the negative z-axis direction) or may not display at a portion thereof near the first end portion 1EP and at a portion thereof near the second end portion 2EP. Alternatively, an image may or may not be displayed at portions of the display area DA nearby the left-end portion (e.g., the left end in the negative y-axis direction) and the right-end portion (e.g., the right end in the positive y-axis direction) interconnecting (e.g., extending between) the first end portion 1EP and the second end portion 2EP. For example, the display DU may occupy the entire display area DA or a portion of (e.g., only a portion of) the display area DA.

The first peripheral area 1PA is located outside the first end portion 1EP of the display area DA, whereas the second peripheral area 2PA is located outside the second end portion 2EP of the display area DA at the opposite end thereof with respect to the first end portion 1EP. Pads for transmitting external electric signals to the display area DA may be arranged at the first peripheral area 1PA and the second peripheral area 2PA.

The display panel DPN, as described above, has a bent or curved shape (e.g., has bent or curved portions) as shown in FIGS. 1 and 2. For example, a portion of the display panel DPN between the display area DA and the first peripheral area 1PA and a portion of the display panel DPN between the display area DA and the second peripheral area 2PA are bent or curved, and thus, the first peripheral area 1PA and the second peripheral area 2PA are located over (e.g., extend over) the rear surface of the display area DA (e.g., in the negative x-axis direction).

A substrate S (refer to FIG. 3) of the display panel DPN may include a bendable or flexible polymer material, such as a plastic film. For example, the substrate S of the display panel DPN may include polyimide (PI), polycarbonate (PC), polyethersulfone (PES), polyethylene terephthalate (PET), polyethylene naphthalate (PEN), polyarylate (PAR), fiberglass reinforced plastic (FRP), etc.

Each of the portions of the display panel DPN between the display area DA and the first peripheral area 1PA and between the display area DA and the second peripheral area 2PA may be bent at least twice, as shown in FIGS. 1 and 2. Therefore, a rear surface 1PA' of the first peripheral area 1PA and a rear surface DA' of the display area DA may face each other and a rear surface 2PA' of the second peripheral area 2PA and the rear surface DA' of the display area DA may face each other.

The first electronic device 1ED is arranged over the rear surface DA' of the display area DA and is electrically connected to the first peripheral area 1PA and the second peripheral area 2PA. In some embodiments, the first electronic device 1ED may not only directly contact the rear surface DA' of the display area DA but may also be arranged spaced from (e.g., spaced apart from) the rear surface DA' of the display area DA, as shown in FIG. 3.

The first electronic device 1ED may be electrically connected to the first peripheral area 1PA and the second peripheral area 2PA (e.g., may be electrically connected to pads at the first and second peripheral areas 1PA and 2PA) by directly contacting (e.g., directly electrically contacting) the first peripheral area 1PA and the second peripheral area 2PA. However, as shown in FIG. 3, the first electronic device 1ED may be electrically connected to the first peripheral area 1PA and the second peripheral area 2PA via a first printed circuit board 1PCB. For example, the first electronic device 1ED may be electrically connected to the first peripheral area 1PA and the second peripheral area 2PA by electrically connecting a first power pad wire 1PP' (refer to FIG. 5) on the first printed circuit board 1PCB to a first power pad 1PP arranged at the first peripheral area 1PA via an anisotropic conductive film (ACF) and by electrically connecting a second power pad wire 2PP' (refer to FIG. 5) on the first printed circuit board 1PCB to a second power pad 2PP arranged at the first peripheral area 1PA via an ACF.

In a flat display apparatus, generally, portions of the display panel between a display area and peripheral areas are not bent. In such cases, a PCB is attached to the peripheral areas, is bent a plurality of times, covers one or more edge portion of the display panel, and extends over the rear surface of the display panel. Furthermore, an electronic device is mounted on a portion of the PCB over the rear surface the display panel. Therefore, because an electrical route from the electronic device to the display area of the display panel is across a top surface of the PCB, which is bent to cover the edge portion of the flat display panel and the display area of the display panel, the electronic distance from the electronic device to the display area is relatively long. As a result, a significant IR drop occurs between the electronic device and the display area, and thus, lower quality images may be displayed.

However, in the display apparatus according to the present embodiment, the display panel DPN is bent, for example, the portions of the display panel DPN between the display area DA and the first peripheral area 1PA and between the display area DA and the second peripheral area 2PA are bent. Thus, the first peripheral area 1PA and the second peripheral area 2PA are arranged over the rear surface of the display area DA (e.g., in the negative x-axis direction) and a distance between the first electronic device 1ED and the display area DA may be significantly reduced. Therefore, an IR drop that occurs between the first electronic device 1ED and the display DU may be significantly reduced, and thus, high quality images may be displayed.

In addition, the display area DA may have a rectangular shape including a major axis (e.g., a y-axis) and a minor axis (e.g., a z-axis). In one embodiment, the first peripheral area 1PA and the second peripheral area 2PA may have shapes extending parallel to the major axis. Furthermore, the first electronic device 1ED may include a DC-DC converter. The first electronic device 1ED may supply power to the display devices arranged at the display DU.

As shown in FIGS. 2 and 3, the display apparatus according to the presented embodiment may include power supply lines PL arranged at the display area DA, the first power pad 1PP arranged at the first peripheral area 1PA and electrically connected to the power supply lines PL, and the second power pad 2PP arranged at the second peripheral area 2PA and electrically connected to the power supply lines PL. Furthermore, the DC-DC converter of the first electronic device 1ED may be electrically connected to the first power pad 1PP and the second power pad 2PP. In this embodiment, the power supply line PL may correspond to the third wire 170 in the pixel circuit of FIG. 1.

The power supply line PL extends from the first end portion 1EP to the second end portion 2EP across the display DU and is electrically connected to the plurality of display devices. Therefore, when an IR drop occurs at the power supply line PL, voltages supplied to the plurality of display devices differ from one another. As a result, the quality of a displayed image degrades.

However, in the display apparatus according to the present embodiment, a first end of the power supply line PL (e.g., in the positive z-axis direction) is connected to the first power pad 1PP, whereas a second end of the power supply line PL (e.g., in the negative z-axis direction) is connected to the second power pad 2PP. Furthermore, the DC-DC converter of the first electronic device 1ED is electrically connected to both the first power pad 1PP and the second power pad 2PP. Because the DC-DC converter of the first electronic device 1ED is electrically connected to the both ends of the power supply line PL, an IR drop that may occur along the power supply line PL may be significantly reduced, and thus, a display apparatus capable of displaying high quality images may be embodied. For example, because the power supply line PL extends along the minor axis of the display area DA, the length of the power supply line PL is significantly reduced and the DC-DC converter of the first electronic device 1ED is electrically connected to the both ends of the power supply line PL, an IR drop that occurs at the power supply line PL may be reduced and the high quality of displayed images may be maintained.

Figure 4:
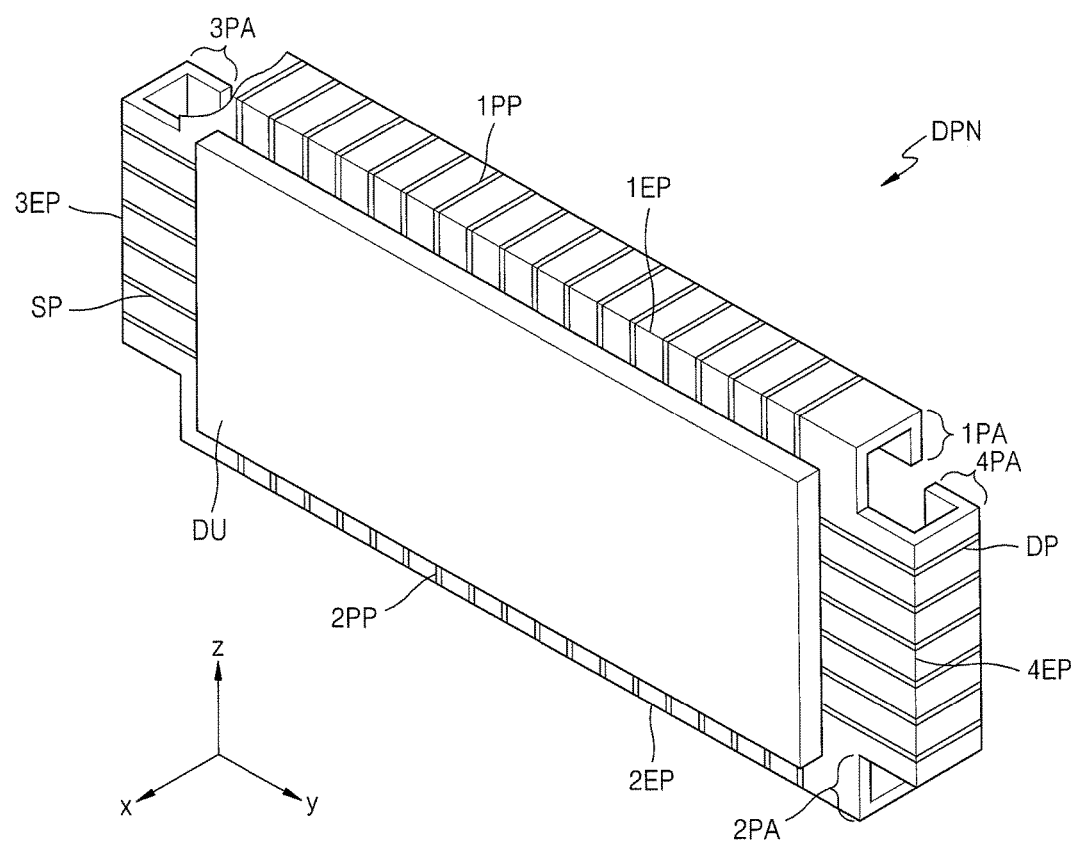
FIG. 4 is a schematic perspective view of a portion of a display apparatus according to another embodiment.
Figure 5:
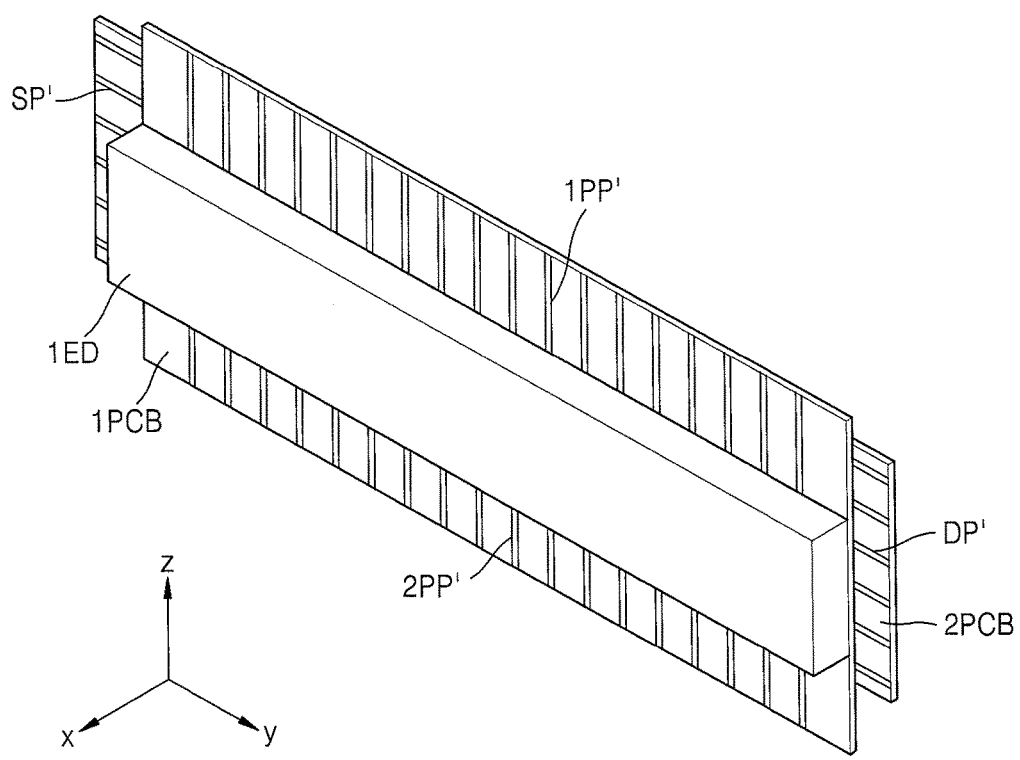
FIG. 5 is a schematic perspective view of another portion of a display apparatus according to an embodiment, which may be attached to the portion shown in FIG. 4.

FIG. 4 is a schematic perspective view of a portion of a display apparatus according to another embodiment, and FIG. 5 is a schematic perspective view of another portion of a display apparatus according to an embodiment, which may be attached to the portion shown in FIG. 4.

The display apparatus according to the present embodiment may be a modification of the display apparatus according to the above-described embodiment. The display panel DPN according to the illustrated embodiment includes a third end portion 3EP (e.g., a third end) that interconnects (e.g., extends between) the first end portion 1EP and the second end portion 2EP of the display area DA and is arranged at an end of the major axis (e.g., the y-axis direction) of the display area DA (e.g., in the negative y-axis direction) and a fourth end portion 4EP (e.g., a fourth end) that interconnects the first end portion 1EP and the second end portion 2EP and is arranged at the opposite end of the display panel DPN from the third end portion 3EP. The display panel DPN further includes a third peripheral area 3PA that has a shape extending parallel to the minor axis (e.g., the z-axis direction) and is arranged outside the third end portion 3EP and a fourth peripheral area 4PA that has a shape extending parallel to the minor axis and is arranged outside the fourth end portion 4EP. In this embodiment, portions of the display panel DPN between the display area DA and the third peripheral area 3PA and between the display area DA and the fourth peripheral area 4PA are bent, and thus, the third peripheral area 3PA and the fourth peripheral area 4PA are arranged over the rear surface of the display area DA.

Each of the portions of the display panel DPN between the display area DA and the third peripheral area 3PA and between the display area DA and the fourth peripheral area 4PA may be bent at least twice, as shown in FIG. 4. Therefore, the rear surface of the third peripheral area 3PA and the rear surface of the display area DA may face each other and the rear surface of the fourth peripheral area 4PA and the rear surface of the display area DA may face each other.

The display apparatus according to the present embodiment further includes a second electronic device, which is arranged over the rear surface of the display area DA and is electrically connected to the third peripheral area 3PA and the fourth peripheral area 4PA. In one embodiment, the second electronic device may be mounted on a second printed circuit board 2PCB arranged over the rear surface of the display area DA, as shown in FIG. 5 for example. Therefore, the second electronic device may be electrically connected to the third peripheral area 3PA and the fourth peripheral area 4PA. For example, as wires on the second printed circuit board 2PCB are electrically connected to a scan pad SP arranged at the third peripheral area 3PA and a data pad DP arranged at the fourth peripheral area 4PA via ACFs or the like, the second electronic device may be electrically connected to the third peripheral area 3PA and the fourth peripheral area 4PA. In one embodiment, as shown in FIG. 5, the second electronic device may be mounted on the rear surface of the second printed circuit board 2PCB (e.g., in the negative x-axis direction).

In a flat display apparatus generally, portions of the display panel between a display area and peripheral areas are not bent (e.g., are flat). In such cases, a PCB is attached to the peripheral areas, and is bent a plurality of times, covers one or more edge portions of the display panel, and extends over the rear surface of the display panel. Furthermore, an electronic device is mounted on a portion of the PCB over the rear surface the display panel. Therefore, because an electrical route from the electronic device to the display area of the display panel is on (e.g., over) a top surface of the PCB, which is bent to cover the edge portion of the flat display panel and the display area of the display panel, the electronic distance from the electronic device to the display area is relatively long. As a result, a significant IR drop occurs between the electronic device and the display area, and thus, lower quality images may be displayed.

However, in the display apparatus according to the present embodiment, the display panel DPN is bent. For example, the portions of the display panel DPN between the display area DA and the third peripheral area 3PA and between the display area DA and the fourth peripheral area 4PA are bent, and the third peripheral area 3PA and the fourth peripheral area 4PA are arranged over the rear surface of the display area DA (e.g., in the negative x-axis direction). Thus, a distance between the second electronic device and the display area DA may be significantly reduced. Therefore, an IR drop that occurs between the second electronic device and the display DU may be significantly reduced, and thus, higher quality images may be displayed.

The second electronic device may include a driver. The second electronic device may supply scan signals and/or data signals to the display devices arranged at the display DU.

As shown in FIG. 4, the display apparatus according to the present embodiment may include scan lines arranged at the display area DA, scan pads SP arranged at the third peripheral area 3PA and electrically connected to the scan lines, data lines arranged at the display area DA, and data pads DP arranged at the fourth peripheral area 4PA and electrically connected to the data lines. Furthermore, the driver of the second electronic device may be electrically connected to the scan pads SP and the data pads DP. For example, scan pad wires SP' of the second printed circuit board 2PCB are electrically connected to the scan pads SP arranged at the third peripheral area 3PA via an ACF or the like, and data pad wires DP' of the second printed circuit board 2PCB are electrically connected to the data pads DP arranged at the fourth peripheral area 4PA via an ACF or the like. Thus, the driver of the second electronic device may be electrically connected to the third peripheral area 3PA and the fourth peripheral area 4PA. In one embodiment, the data line and the scan line may correspond to the first wire 120 and the second wire 130 in the pixel circuit shown in FIG. 1, respectively.

However, because the first printed circuit board 1PCB and the second printed circuit board 2PCB are arranged close to each other as shown in FIG. 5, a short circuit may occur therebetween. Therefore, to prevent a short circuit from occurring therebetween, an insulation layer or an insulation film may be interposed between the first printed circuit board 1PCB and the second printed circuit board 2PCB.

According to the above-described embodiments, a display apparatus capable of displaying high quality images may be embodied. However, the inventive concept is not limited thereto and may provide additional aspects and features.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
 a display panel comprising a display area, a first peripheral area outside a first end of the display area, and a second peripheral area outside a second end of the display area opposite the first end of the display area;
 a power supply line;
 a first power pad arranged at the first peripheral area;
 a second power pad arranged at the second peripheral area, the power supply line being connected to and extending from the first power pad at the first peripheral area through the display area to the second peripheral area at where the power supply line is connected to the second power pad; and
 a first electronic device arranged over a rear surface of the display area and electrically connected to the first power pad in the first peripheral area and to the second power pad in the second peripheral area,
 wherein a portion of the display panel between the display area and the first end and a portion of the display panel between the display area and the second end are bent such that the first peripheral area and the second peripheral area are arranged over the rear surface of the display area.

2. The display apparatus of claim 1, wherein the display area has a major axis and a minor axis, and
 wherein the first peripheral area and the second peripheral area extend parallel to the major axis.

3. The display apparatus of claim 2, wherein the first electronic device comprises a DC-DC converter.

4. The display apparatus of claim 2, further comprising a second electronic device arranged over the rear surface of the display area,
 wherein the display panel further comprises a third peripheral area and a fourth peripheral area, the third peripheral area extending parallel to the minor axis and being arranged outside a third end of the display area, and the fourth peripheral area extending parallel to the minor axis and being arranged outside a fourth end of the display area opposite the third end of the display area,
 wherein the second electronic device is electrically connected to the third peripheral area and the fourth peripheral area, and
 wherein a portion of the display panel between the display area and the third end and a portion of the display panel between the display area and the fourth end are bent such that the third peripheral area and the fourth peripheral area are arranged over the rear surface of the display area.

5. The display apparatus of claim 4, wherein the second electronic device comprises a driver.

6. The display apparatus of claim 5, further comprising:
 a scan line arranged at the display area;
 a data line arranged at the display area;
 a scan pad electrically connected to the scan line and the driver and arranged at the third peripheral area; and
 a data pad electrically connected to the data line and the driver and arranged at the fourth peripheral area.

7. The display apparatus of claim 4, wherein the portion of the display panel between the display area and the third end and the portion of the display panel between the display area and the fourth end are bent such that a rear surface of the third peripheral area and the rear surface of the display area face each other and a rear surface of the fourth peripheral area and the rear surface of the display area face each other.

8. The display apparatus of claim 1, wherein the portion of the display panel between the display area and the first end and the portion of the display panel between the display area and the second end are bent such that a rear surface of the first peripheral area and the rear surface of the display area face each other and a rear surface of the second peripheral area and the rear surface of the display area face each other.

* * * * *